(12) United States Patent
Suzuki et al.

(10) Patent No.: US 11,470,724 B2
(45) Date of Patent: Oct. 11, 2022

(54) MANUFACTURING APPARATUS FOR PERFORMING ADDITIVE MANUFACTURING OF AN ELECTRICAL DEVICE

(71) Applicant: FUJI CORPORATION, Chiryu (JP)

(72) Inventors: Masato Suzuki, Chiryu (JP); Akihiro Kawajiri, Chiryu (JP); Masatoshi Fujita, Anjo (JP); Kenji Tsukada, Toyota (JP); Yoshitaka Hashimoto, Kariya (JP)

(73) Assignee: FUJI CORPORATION, Chiryu (JP)

( * ) Notice: Subject to any disclaimer, the term of this patent is extended or adjusted under 35 U.S.C. 154(b) by 240 days.

(21) Appl. No.: 16/688,579

(22) Filed: Nov. 19, 2019

(65) Prior Publication Data
US 2020/0093000 A1 Mar. 19, 2020

Related U.S. Application Data

(62) Division of application No. 15/512,101, filed as application No. PCT/JP2014/074829 on Sep. 19, 2014, now Pat. No. 10,667,403.

(51) Int. Cl.
*H05K 3/00* (2006.01)
*B33Y 30/00* (2015.01)
(Continued)

(52) U.S. Cl.
CPC .......... *H05K 3/0008* (2013.01); *B22F 3/105* (2013.01); *B23P 21/004* (2013.01); *B29C 67/00* (2013.01);
(Continued)

(58) Field of Classification Search
CPC .... H05K 3/0014; H05K 3/0008; H05K 3/202; H05K 3/103; H05K 3/1241;
(Continued)

(56) References Cited

U.S. PATENT DOCUMENTS 5,594,652 A 1/1997 Penn
5,783,008 A 7/1998 Belke, Jr.
(Continued)

FOREIGN PATENT DOCUMENTS

| CN | 103327741 A | 9/2013 | |
|---|---|---|---|
| JP | 2011-241450 A | 12/2011 | |
| WO | WO-2008102266 A2 * | 8/2008 | ........... H05K 3/4664 |

OTHER PUBLICATIONS

Extended European Search Report dated Apr. 24, 2018 in Patent Application No. 14902233.7, 8 pages.
(Continued)

*Primary Examiner* — Jeffrey T Carley
(74) *Attorney, Agent, or Firm* — Oblon, McClelland, Maier & Neustadt, L.L.P.

(57) ABSTRACT

A manufacturing apparatus that includes a conveyance device that moves a stage, where an electronic device shaped by multiple layers is placed, in X-axis and Y-axis directions. A first shaping unit, a second shaping unit, and a component mounting unit are arranged within a range in which the stage can move. The manufacturing apparatus performs additive manufacturing of the electronic device on the stage by performing a sequential movement of the stage to respective working positions of different units. As a result, in this manufacturing apparatus, a workpiece on the stage does not have to be removed and repositioned during each work process such as shaping by a first shaping unit, shaping by a second shaping unit, and electronic component mounting by a component mounting unit.

12 Claims, 9 Drawing Sheets

(51) Int. Cl.
  *B33Y 10/00* (2015.01)
  *B22F 3/105* (2006.01)
  *B29C 67/00* (2017.01)
  *H05K 3/12* (2006.01)
  *H05K 1/09* (2006.01)
  *H05K 3/46* (2006.01)
  *B33Y 80/00* (2015.01)
  *B23P 21/00* (2006.01)
  *H05K 3/10* (2006.01)

(52) U.S. Cl.
  CPC .......... *B29C 67/0003* (2013.01); *B33Y 10/00* (2014.12); *B33Y 30/00* (2014.12); *B33Y 80/00* (2014.12); *H05K 1/097* (2013.01); *H05K 3/0014* (2013.01); *H05K 3/103* (2013.01); *H05K 3/1241* (2013.01); *H05K 3/4664* (2013.01); *H05K 2203/107* (2013.01); *H05K 2203/1131* (2013.01)

(58) Field of Classification Search
  CPC ................. H05K 3/4664; H05K 1/097; H05K 2203/107; H05K 2203/1131; B29C 70/882; B29C 67/00; B29C 67/0003; B23P 21/004; B33Y 10/00; B33Y 30/00; B33Y 80/00; B22F 3/105
  See application file for complete search history.

(56) References Cited

U.S. PATENT DOCUMENTS

| | | | | |
|---|---|---|---|---|
| 6,153,034 A * | 11/2000 | Lipsker | ................... | B29C 64/40 156/73.1 |
| 7,556,490 B2 | 7/2009 | Wicker | | |
| 7,658,603 B2 * | 2/2010 | Medina | ................... | B33Y 10/00 425/375 |
| 2002/0019683 A1 * | 2/2002 | White | ................... | B33Y 50/02 700/255 |
| 2002/0147521 A1 * | 10/2002 | Mok | ................... | B29C 64/118 700/159 |
| 2004/0035306 A1 * | 2/2004 | Onishi | ................. | H05K 3/1216 101/123 |
| 2004/0151978 A1 * | 8/2004 | Huang | .................... | H01F 1/009 429/83 |
| 2007/0248798 A1 * | 10/2007 | Tsuruoka | ............... | H05K 3/125 428/195.1 |
| 2007/0286946 A1 * | 12/2007 | Yamaguchi | ............. | H01L 24/76 427/97.3 |
| 2009/0255426 A1 * | 10/2009 | Doyle | ................. | H05K 3/0008 101/129 |
| 2010/0109688 A1 | 5/2010 | Eldridge et al. | | |
| 2010/0291304 A1 * | 11/2010 | Becker | ..................... | H05K 3/00 427/355 |
| 2011/0285060 A1 | 11/2011 | Yamamoto et al. | | |
| 2013/0089642 A1 * | 4/2013 | Lipson | .................. | B29C 64/106 426/115 |
| 2013/0170171 A1 * | 7/2013 | Wicker | ............... | H01L 21/4846 361/809 |
| 2014/0231266 A1 | 8/2014 | Sherrer et al. | | |
| 2014/0268604 A1 | 9/2014 | Wicker | | |
| 2015/0091208 A1 * | 4/2015 | Sadusk | ................. | B29C 64/393 264/308 |
| 2015/0197062 A1 * | 7/2015 | Shinar | ................... | B29C 64/112 700/98 |
| 2015/0201500 A1 | 7/2015 | Shinar | | |
| 2015/0375453 A1 * | 12/2015 | Yost | ..................... | B29C 64/393 435/174 |
| 2016/0198576 A1 * | 7/2016 | Lewis | ..................... | H01L 24/75 361/761 |
| 2017/0042034 A1 | 2/2017 | Maccurdy | | |

OTHER PUBLICATIONS

International Search Report dated Nov. 18, 2014, in PCT/JP2014/074829, filed Sep. 19, 2014.

* cited by examiner

MANUFACTURING APPARATUS FOR PERFORMING ADDITIVE MANUFACTURING OF AN ELECTRICAL DEVICE

CROSS-REFERENCE TO RELATED APPLICATIONS

This application is a division of U.S. application Ser. No. 15/512,101, filed Mar. 17, 2017, which is a National Stage of International Application No. PCT/JP2014/074829, filed Sep. 19, 2014, the entire contents of which are incorporated herein by reference.

TECHNICAL FIELD

The present application relates to a manufacturing apparatus and a manufacturing method for manufacturing an electrical device by using additive manufacturing.

BACKGROUND ART

An example of a three-dimensional article manufacturing method is additive manufacturing, in which a three-dimensional article is manufactured by sequentially stacking layers of materials for forming a three-dimensional article to be formed of multiple layers. Stereo lithography (SL), selective laser sintering (SLS), fused deposition molding (FDM), and the like are known as forms of additive manufacturing. For example, in the manufacturing apparatus that is disclosed in PTL 1, a flat plate-shaped material formed by metal and resin powder materials being pressed is placed on a stage capable of moving in three axial directions. This flat plate-shaped material is melted by being exposed to laser light, and solidifies with time to become a layered article (referred to as a "flat plate-shaped material member" in PTL 1). Then, the manufacturing apparatus stacks the next flat plate-shaped material member after flattening the surface of the flat plate-shaped material member. The manufacturing apparatus joins the new portion to the already-shaped portion by exposing the stacked flat plate-shaped material member to laser light to cause the flat plate-shaped material member to melt and subsequently solidify. The three-dimensional article is manufactured by the stacking, melting, solidifying, and flattening of the flat plate-shaped material member being sequentially repeated.

PTL 1: JP-A-2011-241450

SUMMARY

This type of manufacturing apparatus can be applied to the shaping of a multilayer wiring board provided with a wiring pattern and an insulating layer using, for example, a conductive material obtained by metal melting and an insulating material obtained by resin melting. In addition, by combining this apparatus with an electronic component mounting machine, a manufacturing apparatus capable of collectively carrying out a series of works ranging from multilayer wiring board shaping to electronic component mounting can be realized. Assuming this type of manufacturing apparatus, however, electronic component mounting on the three-dimensional article is required in some cases during, for example, sequential stacking of multiple layers obtained by the slicing of the multilayer wiring board to a predetermined thickness. Accordingly, the three-dimensional article in the manufacturing process needs to be removed from a printing device or mounting machine and transferred to another device during each work process such as insulating layer shaping, wiring pattern shaping, and electronic component mounting. As a result, the three-dimensional article needs to be rearranged and repositioned during a movement between the devices, which results in the lack of a smooth work process transition.

The present disclosure has been made in view of the above-described circumstances, and an object thereof is to provide a manufacturing apparatus and a manufacturing method allowing the length of time required for a work process transition to be reduced in a manufacturing apparatus that manufactures an electrical device using additive manufacturing.

In order to solve the above problem, a manufacturing apparatus according to of the present application includes a stage including a placing surface where a three-dimensional article is placed, a driving device that moves the stage in a first direction and a second direction, the first direction and the second direction being directions parallel to the placing surface and different from each other, a shaping unit that is disposed within a range in which the stage can be moved and forms each layer of the three-dimensional article to be formed of multiple layers, a mounting unit that is disposed within the range in which the stage can be moved and mounts an electronic component on a layered workpiece formed by the shaping unit, and a control section that sequentially moves the stage to a working position of either the shaping unit or the mounting unit along a path determined based on a work process to perform additive manufacturing of an electrical device on the stage. Examples of the electrical device include a multilayer wiring board on which an electronic component is mounted and an electrical instrument having a built-in electronic component such as a connector.

In the manufacturing apparatus, the first direction and the second direction are directions orthogonal to each other and the driving device is configured to be capable of moving the stage in a third direction as well as the first and second directions, the third direction being orthogonal to the placing surface.

In the manufacturing apparatus, the shaping unit and the mounting unit are in a state where the working positions with respect to the third direction are fixed and the working positions are positioned on the same plane.

In the manufacturing apparatus, the shaping unit has an ejecting section that ejects a liquid material onto the stage by droplet ejection.

In the manufacturing apparatus, the three-dimensional article is a multilayer wiring board and multiple of the shaping units are provided, with the two or more shaping units including at least a shaping unit that shapes a wiring pattern by firing a conductive material ejected onto the stage by the ejecting section, and a shaping unit that shapes an insulating layer by curing an insulating material ejected onto the stage by the ejecting section.

In the manufacturing apparatus, the shaping unit and the mounting unit are configured to be capable of being attached to and detached from a manufacturing apparatus main body.

In the manufacturing apparatus, arrangement of the shaping unit and the mounting unit with respect to a movement direction of the stage is determined based on the work process such that the stage movement path is minimized in length.

In order to solve the above problem, a manufacturing method according to of the present application includes: causing a manufacturing apparatus including a stage having a placing surface where a three-dimensional article is placed, a driving device that moves the stage in a first direction and a second direction, the first direction and the second direction being directions parallel to the placing surface and different from each other, a shaping unit that is disposed within a range in which the stage can be moved and forms each layer of the three-dimensional article to be formed of multiple layers, and a mounting unit that is disposed within the range in which the stage can be moved and mounts an electronic component on a layered workpiece formed by the shaping unit, to sequentially move the stage to a working position of either the shaping unit or the mounting unit along a path determined based on a work process, and perform additive manufacturing of an electrical device on the stage.

The manufacturing apparatus according to of the present application is provided with the driving device that moves the stage where the three-dimensional article is placed in the first direction and the second direction. The first and second directions are the different directions parallel to the placing surface of the stage. The shaping unit that forms each layer of the three-dimensional article and the mounting unit that mounts the electronic component are arranged within the range in which the stage can be moved. The control section performs the additive manufacturing of the electrical device on the stage by performing the sequential movement of the stage to the working position of each unit in accordance with the work process. Examples of methods by which the three-dimensional article is shaped by the shaping unit include stereo lithography, selective laser sintering, fused deposition molding, UV curing inkjetting, and inkjet bindering. More specifically, the examples include a method in which laser sintering is performed with metal and resin powder spread in layers, a method in which solidification is performed with a binder (binding material) added, a method in which UV curable resin ejection is performed by inkjetting and then curing is performed by ultraviolet ray emission, and a method in which laminating is performed by thermoplastic resin melting at a high temperature.

In this manufacturing apparatus, the electronic component can be mounted by the mounting unit during the additive manufacturing of the electrical device by the shaping unit with the stage moved by the driving device to the working position of each unit arranged within the range in which the stage can be moved. Accordingly, the workpiece on the stage does not have to be removed and repositioned during each work process such as insulating layer shaping, wiring pattern shaping, and electronic component mounting, and thus a smooth work process transition is achieved. As a result, the manufacturing apparatus achieves a reduction in the length of time required for a work process transition. The manufacturing apparatus is suitable as, for example, an apparatus for manufacturing prototypes of electronic component mounting boards (such as test circuits). Specifically, the apparatus as a whole can be reduced in size in step with a reduction in the size of the shaping unit in the case of manufacturing of a circuit board that does not require mass production, as in the case of a test circuit, because the number of electronic components to be held by the mounting unit is small in such cases. In addition, since a series of works ranging from multilayer wiring board shaping to electronic component mounting can be collectively carried out by this single manufacturing apparatus, this manufacturing apparatus is suitable for a work in which test circuits with a relatively low production time limit are automatically and collectively manufactured.

In the manufacturing apparatus according to of the present application, the driving device is capable of moving the stage in the first to third directions that are orthogonal to one another. Accordingly, in this manufacturing apparatus, the shaping process can continue to be performed without shaping unit working position adjustment by, for example, the driving device adjusting the position of the stage in the third direction in accordance with an increase in the number of layers of the workpiece to be formed of the multiple layers, that is, in accordance with an increase in the height of the workpiece shaped on the stage. Accordingly, the working position of each unit can be fixed by the stage side being subjected to positional adjustment in accordance with the working position of each unit. Each unit as a whole can be reduced in size because the manufacturing apparatus requires no driving mechanism for driving in the third direction or the like.

In the manufacturing apparatus according to of the present application, the respective working positions of the shaping unit and the mounting unit are fixed in the third direction and aligned on the same plane. Accordingly, in the case of a stage movement between the respective units of this manufacturing apparatus, the amount of adjustment by which the stage is adjusted in position with respect to the third direction is extremely small or the adjustment is not required at all, and the length of the work time that is required for stage position adjustment, that is, the length of manufacturing time, can be further reduced.

In the manufacturing apparatus according to of the present application, the shaping unit is provided with the ejecting section, and thus the workpiece can be appropriately shaped by the stacked layers on the stage by the use of droplet ejection (such as inkjetting).

The two or more shaping units are provided in the manufacturing apparatus according to the present application, the two or more shaping units including the shaping unit that shapes the wiring pattern by droplet ejection-based conductive material ejection and firing and the shaping unit that shapes the insulating layer by insulating material ejection and curing. Accordingly, the manufacturing apparatus is capable of quickly shaping the multilayer wiring board by additive manufacturing by moving the stage between the two shaping units and properly using the two shaping units depending on the work process for the shaping of the wiring pattern or the insulating layer.

In the manufacturing apparatus according to of the present application, each of the shaping unit and the mounting unit is configured to be capable of being attached to and detached from the manufacturing apparatus main body, and thus additional installation of a necessary unit and removal of an unnecessary unit can be performed depending on the type, structure, and the like of the electrical device to be manufactured. Accordingly, the manufacturing apparatus is capable of responding to the manufacturing of various types of electrical devices, thus enhancing its versatility.

In the manufacturing apparatus according to of the present application, the arrangement of the shaping unit and the mounting unit is determined such that the path length of the stage moved as a result of the progress of the work process is minimized. Accordingly, a user of the manufacturing apparatus or the like can reduce the length of the movement time of the stage moving between the units during the work process transition by, for example, changing the direction of each of the units with respect to the movement direction of the stage in accordance with an instruction given by the manufacturing apparatus or the like.

The disclosure of the present application is not limited to the manufacturing apparatus and can also be carried out as a manufacturing method for a manufacturing apparatus provided with a stage where a three-dimensional article is placed, a driving device moving the stage, a shaping unit, and a mounting unit.

DESCRIPTION OF EMBODIMENTS

Figure 1:
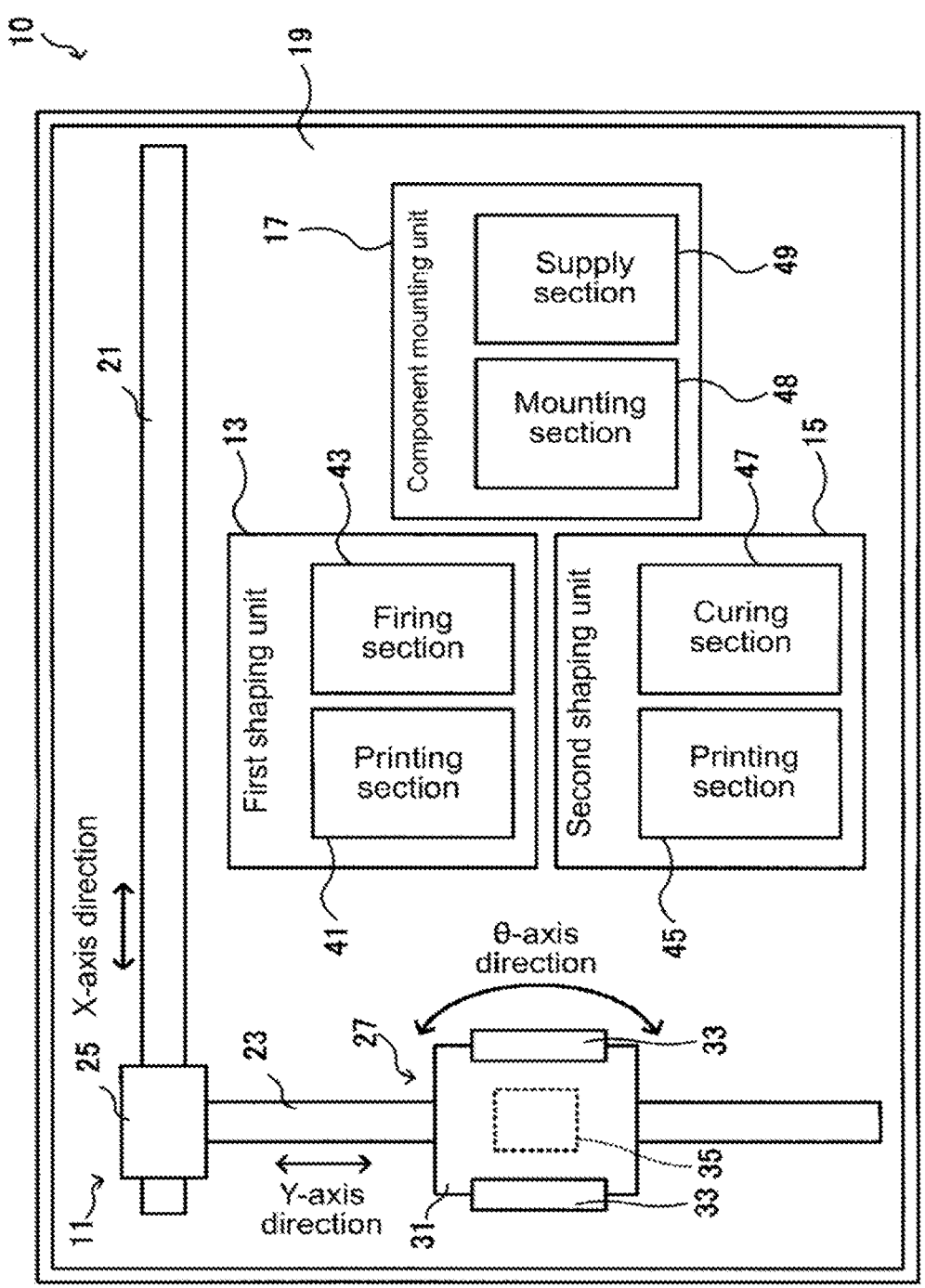
FIG. 1 is a schematic diagram illustrating a configuration of an electronic device manufacturing apparatus according to the present embodiment.

Hereinafter, an electronic device manufacturing apparatus as an embodiment of a manufacturing apparatus according to the present disclosure will be described with reference to the accompanying drawings. FIG. 1 is a diagram illustrating a configuration of electronic device manufacturing apparatus (hereinafter, simply referred to as a "manufacturing apparatus" in some cases) 10 according to the present embodiment. Manufacturing apparatus 10 is provided with conveyance device 11, first shaping unit 13, second shaping unit 15, and component mounting unit 17. In manufacturing apparatus 10, units 13, 15, and 17 and so on are arranged on base 19. Base 19 has a substantially rectangular shape in a plan view. In the following description, a longitudinal direction of base 19 will be referred to as an X-axis direction, a short direction of base 19 will be referred to as a Y-axis direction, a direction that is orthogonal to both the X-axis direction and the Y-axis direction will be referred to as a Z-axis direction, and a direction of rotation about a straight line along the Z-axis direction will be referred to as a θ-axis direction.

Conveyance device 11 has X-axis slide mechanism 21 that extends in the X-axis direction and Y-axis slide mechanism 23 that extends in the Y-axis direction. X-axis slide mechanism 21 is held by base 19 and is disposed such that X-axis slider 25 can be moved in the X-axis direction. X-axis slider 25 of X-axis slide mechanism 21 is moved to any position in the X-axis direction due to the driving of electromagnetic motor 61 (refer to FIG. 2). One end section of Y-axis slide mechanism 23 in the Y-axis direction is held by X-axis slider 25 and Y-axis slide mechanism 23 is arranged such that stage 27 can be moved in the Y-axis direction. Stage 27 of Y-axis slide mechanism 23 is moved to any position in the Y-axis direction due to the driving of electromagnetic motor 63 (refer to FIG. 2). Accordingly, stage 27 can be moved to any position on base 19 by X-axis slide mechanism 21 and Y-axis slide mechanism 23 being driven.

Stage 27 has base 31 and holding device 33. Base 31 has the shape of a flat plate and shaping plate P (refer to FIG. 3) is placed on an upper face of base 31. Holding device 33 is arranged on both sides of base 31 in the X-axis direction. Stage 27 fixedly holds shaping plate P at a predetermined position by pinching an X-axis direction end section of shaping plate P placed on base 31 between base 31 and holding device 33. The X-axis direction and the Y-axis direction are directions that are orthogonal to each other and are parallel to a surface of base 31 on which shaping plate P is placed (one example of a placing surface).

Conveyance device 11 also has lifting and lowering device 35 that lifts and lowers base 31 along with shaping plate P in the Z-axis direction. Lifting and lowering device 35 changes a position of shaping plate P in the Z-axis direction by lifting or lowering base 31 in due to the driving of driving section 65 (refer to FIG. 2). Driving section 65 is provided with, for example, an air cylinder as a driving source that lifts and lowers the base 31. In addition, lifting and lowering device 35 rotates base 31 in the θ-axis direction due to the driving of driving section 65. Driving section 65 is provided with, for example, an electromagnetic motor as a driving source that rotates base 31 in the θ-axis direction. Together with stage 27, lifting and lowering device 35 is moved to any position on base 19.

The three units 13, 15, and 17, that is, first shaping unit 13, second shaping unit 15, and component mounting unit 17, are arranged above base 19 (near side in the Z-axis direction in FIG. 1). Manufacturing apparatus 10 has a configuration that allows each of units 13, 15, and 17 to be attached to and detached from a connecting section (not illustrated) disposed at an upper portion of the apparatus. Manufacturing apparatus 10 is provided with, for example, multiple common connectors as connecting sections to which the respective units 13, 15, and 17 can be connected and a holding mechanism holding each of the units 13, 15, and 17 connected to the connectors. Accordingly, manufacturing apparatus 10 allows various units to be additionally installed or removed in accordance with the type of electronic device 100 to be manufactured (refer to FIG. 10) or the like. Units 13, 15, and 17 perform various works on shaping plate P from above stage 27 and shaping plate P, examples of the works including shaping of a three-dimensional article and mounting of electronic components 95 (refer to FIG. 10).

First shaping unit 13 is a unit that shapes, for example, wiring pattern 75 and pillars 91 and 99 of electronic device 100 (refer to FIG. 10) and first shaping unit 13 is provided with first printing section 41 and firing section 43. First printing section 41 ejects a conductive material onto shaping plate P by, for example, driving inkjet head 71 (refer to FIG. 3). The conductive material is, for example, an ink that contains metal nanoparticles (such as silver). Inkjet head 71 ejects the conductive material from multiple nozzles juxtaposed in the Y-axis direction by, for example, a piezo method using a piezoelectric element.

Firing section 43 performs laser light emission from an emitting section 73 (refer to FIG. 4) and firing on the conductive material ejected onto shaping plate P. Then, for example, once shaping plate P has been moved to a position below first printing section 41 as a result of a movement of stage 27, shaping unit 13 forms wiring pattern 75 and pillars 91 and 99 by firing the ejected conductive material with emitting section 73 while ejecting the conductive material onto shaping plate P with inkjet head 71.

Second shaping unit 15 is a unit that shapes, for example, insulating layer 85 (refer to FIG. 10) of electronic device 100 and second shaping unit 15 is provided with second printing section 45 and curing section 47. Second printing section 45 ejects a UV curable resin onto shaping plate P by, for example, driving inkjet head 77 (refer to FIG. 5). Inkjet head 77 may use, for example, a piezo method using a piezoelectric element or a thermal method based on ejection from a nozzle port of bubbles generated as a result of resin heating.

Curing section 47 is provided with smoothing roller section 79 (refer to FIG. 6) that performs smoothing on an upper face of the UV curable resin ejected in the form of a single layer or predetermined multiple layers onto shaping plate P by inkjet head 77. Smoothing roller section 79 maintains a uniform thickness of each layer by, for example, smoothing a surface of the UV curable resin while scraping and collecting a surplus resin with a roller or a blade (not illustrated).

Curing section 47 also has light emitting section 81 (refer to FIG. 6) that emits ultraviolet rays downward. Light emitting section 81 is provided with, for example, a mercury lamp or an LED as a light source. Curing section 47 performs the ultraviolet ray emission and curing on the UV curable resin ejected onto shaping plate P by driving light emitting section 81. Then, for example, once shaping plate P has been moved to a position below second printing section 45 as a result of a movement of stage 27, second shaping unit 15 shapes insulating layer 85 by curing the ejected UV curable resin with curing section 47 while ejecting the UV curable resin onto shaping plate P with inkjet head 77.

Component mounting unit 17 is a unit that mounts various electronic components 95 (refer to FIG. 8) connected to pillar 91 shaped by first shaping unit 13, and component mounting unit 17 is provided with mounting section 48 and supply section 49. Mounting section 48 has a mounting head that holds electronic component 95 with suction nozzle 93 (refer to FIG. 8). In addition, mounting section 48 has a nozzle lifting and lowering device that lifts and lowers suction nozzle 93 and a nozzle rotation device that rotates suction nozzle 93 about an axial center; mounting section 48 is capable of changing a Z-axis direction position of electronic component 95 held by suction nozzle 93 and a posture in which electronic component 95 is held. Mounting section 48 may also be provided with a camera for confirming a mounting position by imaging wiring pattern 75, pillar 91, or the like, and a camera for imaging electronic component 95 and confirming the position of the component.

Supply section 49 has, for example, multiple tape feeders, each of which feeds taped electronic components 95 one at a time, thus supplying electronic components 95 to mounting section 48. Supply section 49 is not limited to a tape feeder and may be a tray-type supply device wherein electronic components 95 are supplied and picked up from a tray. Supply section 49 may also be configured to be provided with both tape-type and tray-type supply devices or a supply device other than the tape-type and tray-type supply devices. For example, once shaping plate P has been moved to a position below mounting section 48 as a result of a movement of stage 27, component mounting unit 17 supplies a required component by driving supply section 49 and moving the mounting head of mounting section 48 to a component supply position of supply section 49. Then, mounting section 48 mounts the electronic component 95 picked up from the supply position of supply section 49 by suction nozzle 93 of the mounting head at a position corresponding to, for example, a position where pillar 91 of a workpiece shaped on shaping plate P is shaped or is planned to be shaped.

The three units 13, 15, and 17 described above are positioned on the same planes parallel to one another in the X-axis direction and the Y-axis direction with respective working positions of units 13, 15, and 17 fixed in the Z-axis direction. Specifically, for example, a nozzle port of inkjet head 71 of first shaping unit 13 and a nozzle port of inkjet head 77 of second shaping unit 15 share the same fixed position in the Z-axis direction. In other words, Z-axis-direction distances from stage 27 (three-dimensional article to be shaped) to inkjet heads 71 and 77 are equal to each other in a state where stage 27 does not move in the Z-axis direction. Likewise, for example, a position (working position) at a time when a droplet of the conductive material ejected from inkjet head 71 reaches the workpiece undergoing shaping on stage 27 is the same in the Z-axis direction as a position (working position) at a time when electronic component 95 held by the mounting head of mounting section 48 by the use of suction nozzle 93 is mounted on the workpiece. As a result, in manufacturing apparatus 10 according to the present embodiment, the amount by which the stage 27 is adjusted in position with respect to the Z-axis direction is extremely small, or adjustment is not required at all, in the case of a movement of stage 27 between the respective units 13, 15, and 17.

Figure 2:
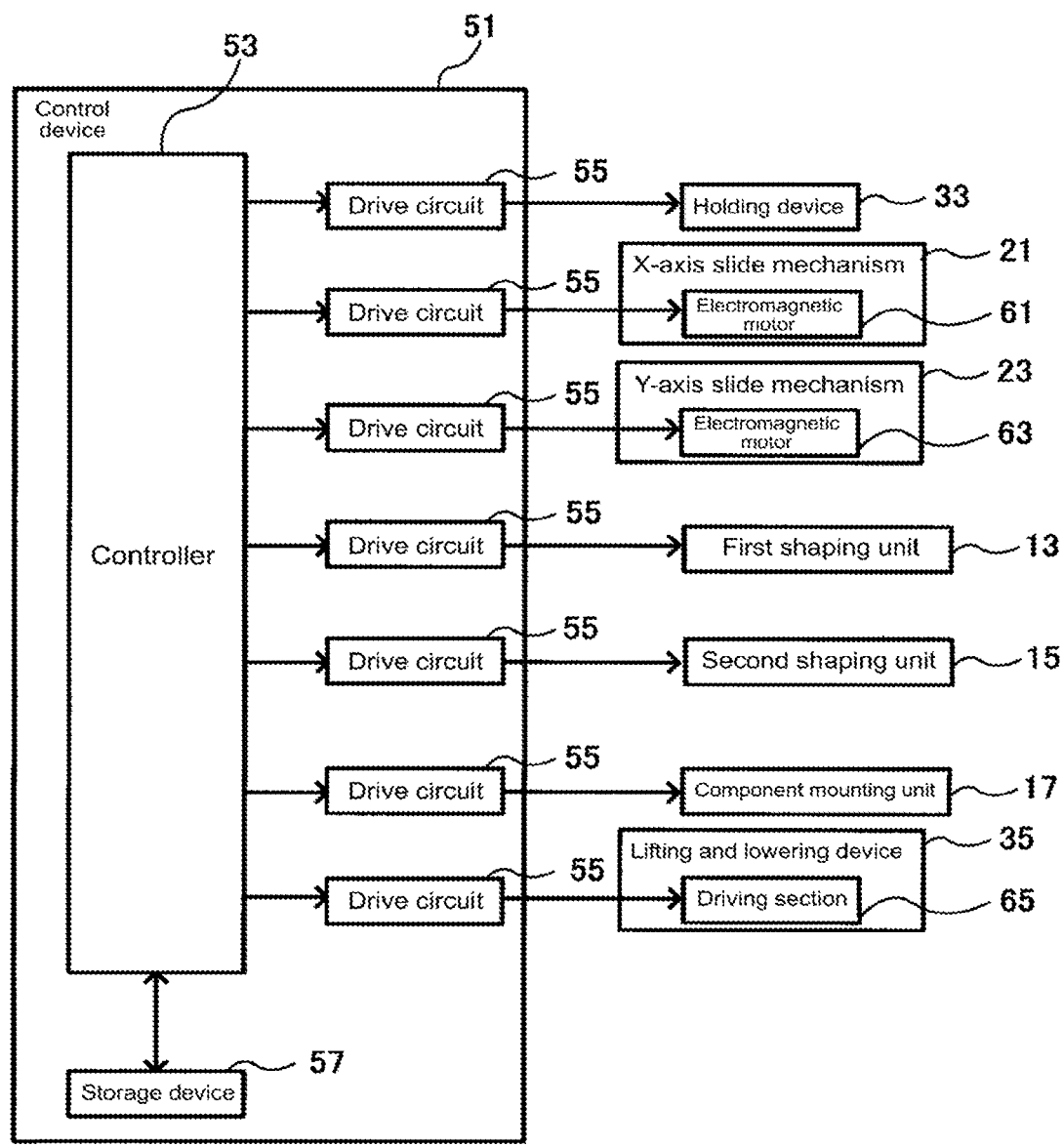
FIG. 2 is a block diagram illustrating the configuration of the electronic device manufacturing apparatus.

As illustrated in FIG. 2, manufacturing apparatus 10 is provided with control device 51 that controls the entire apparatus. Control device 51 is provided with controller 53 and multiple drive circuits 55. Controller 53 is provided with a CPU, a ROM, a RAM, and so on, has a computer as its main component, and is connected to the multiple drive circuits 55. Control device 51 also has storage device 57, in which control data is stored for conveyance device 11 and each of the units 13, 15, and 17 to be controlled in accordance with a work process regarding electronic device 100 to be manufactured. Storage device 57 is, for example, an optical drive device such as a hard disk device. The control data stored in storage device 57 is, for example, data including shaping data regarding sectional shapes of multiple layers obtained by insulating layer 85 of electronic device 100 being sliced to be given a predetermined thickness, and positional information (such as a recipe) for mounting electronic component 95 on shaped insulating layer 85. The multiple drive circuits 55 are respectively connected to the above-described holding device 33, electromagnetic motors 61 and 63, driving section 65, units 13, 15, and 17, and the like. Controller 53 controls operations of holding device 33 and so on via drive circuits 55 based on, for example, the control data in storage device 57. Controller 53 sequentially moves stage 27 to the working position of first shaping unit 13, second shaping unit 15, or component mounting unit 17 in accordance with the work process based on the control data for the manufacturing of electronic device 100 on shaping plate P.

Figure 10:
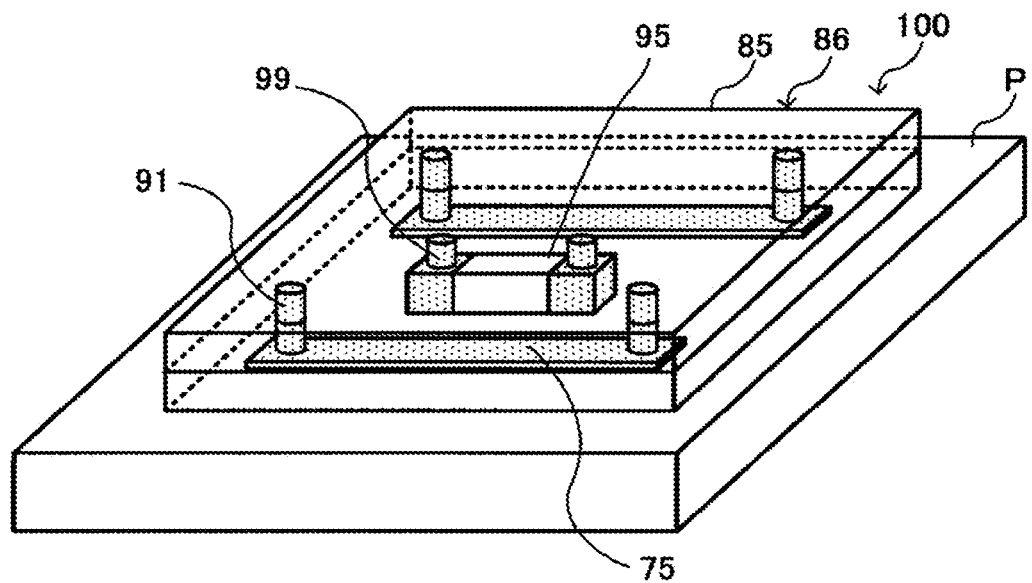
FIG. 10 is a schematic diagram for showing the electronic device manufacturing process.

Hereinafter, operation will be described in which electronic device 100 is manufactured by manufacturing apparatus 10. By means of the configuration described above, manufacturing apparatus 10 according to the present embodiment shapes, for example, multilayer wiring board 86 in which wiring pattern 75 and pillars 91 and 99 connected to electronic component 95 embedded in insulating layer 85 are formed as illustrated in FIG. 10 by sequentially stacking, onto shaping plate P, layers configuring multilayer wiring board 86 to be formed of multiple layers.

Figure 3:
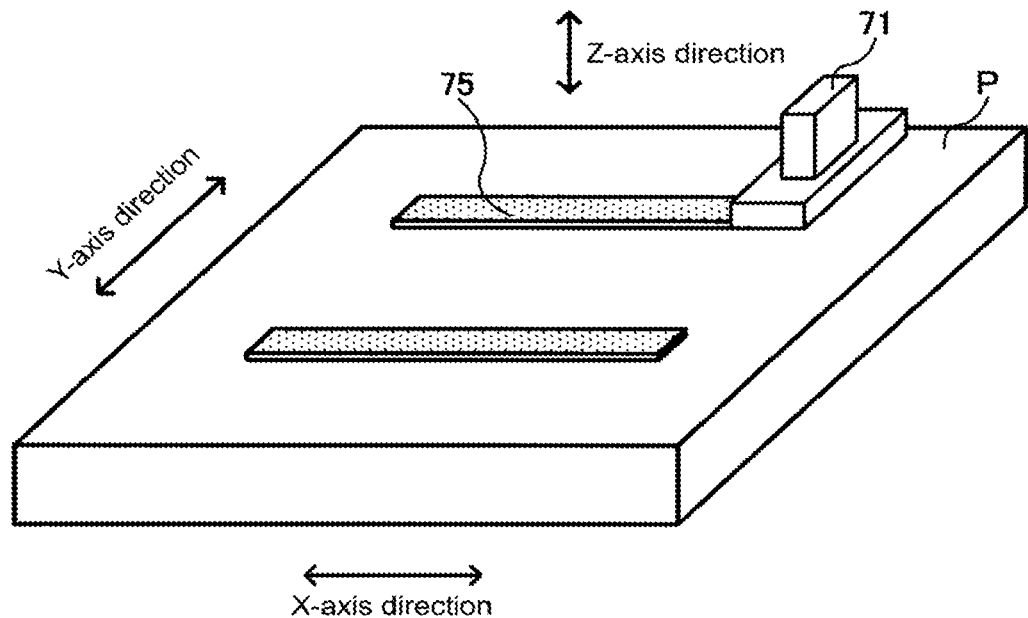
FIG. 3 is a schematic diagram for showing an electronic device manufacturing process.

More specifically, controller 53 of control device 51 first controls X-axis slide mechanism 21 and Y-axis slide mechanism 23, carries stage 27 (refer to FIG. 1) where shaping plate P illustrated in FIG. 3 is set into first shaping unit 13, and moves it to a portion below inkjet head 71, which is a working position of first printing section 41. Controller 53 controls first shaping unit 13 based on the shaping data regarding the sectional shape of the first layer stored in storage device 57 and ejects conductive material onto shaping plate P from inkjet head 71. A film of the conductive material formed by multiple droplets is formed on shaping plate P.

Figure 4:
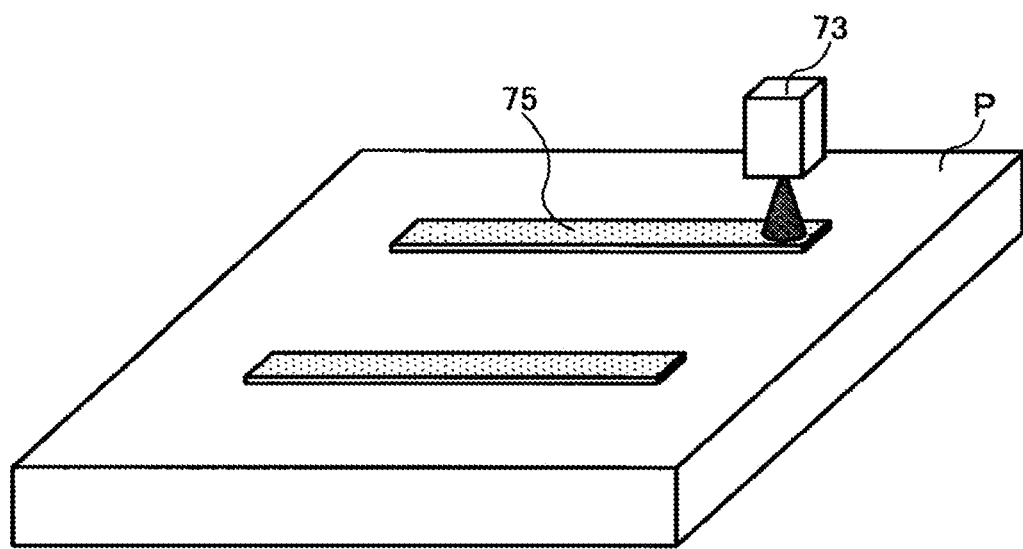
FIG. 4 is a schematic diagram for showing the electronic device manufacturing process.

In addition, controller 53 controls firing section 43 and performs local heating and firing by emitting laser light from emitting section 73 to the film of the conductive material ejected by inkjet head 71 as illustrated in FIG. 4. As a result, the sectional shape of the first layer is shaped on shaping plate P. Examples of a laser light source for firing section 43 include a semiconductor laser, a carbon dioxide laser, and a YAG laser.

Controller 53 may perform the firing on the multiple layers all at once by the use of emitting section 73 with the multiple layers printed in advanced by inkjet head 71. Controller 53 may shape the desired wiring pattern 75 on shaping plate P by conducting the works that are illustrated in FIG. 3 and FIG. 4 once or multiple times. In addition, controller 53 may conduct the ejection by inkjet head 71 in parallel with the heating process by emitting section 73 (refer to FIG. 7).

For example, controller 53 may conduct the work of first shaping unit 13 while moving both shaping plate P and stage 27 in the X-axis direction, the Y-axis direction, and the Z-axis direction as illustrated in FIG. 3. Because stage 27 is moved as a main component in manufacturing apparatus 10 according to the present embodiment, inkjet head 71 and emitting section 73 of first shaping unit 13 can have fixed positions (in the X-axis direction and the like).

Figure 5:
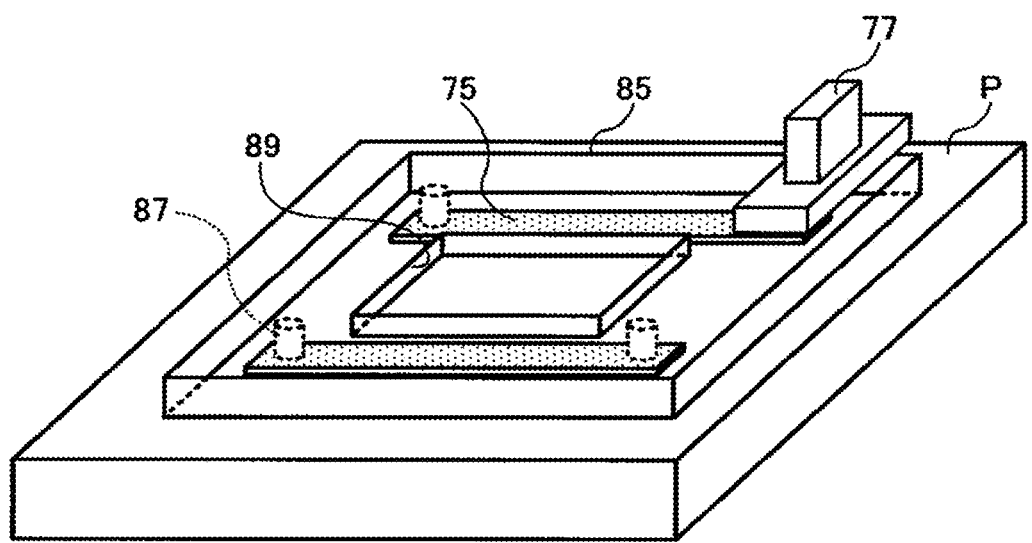
FIG. 5 is a schematic diagram for showing the electronic device manufacturing process.

Subsequently, controller 53 controls X-axis slide mechanism 21 and Y-axis slide mechanism 23, carries shaping plate P and stage 27 into second shaping unit 15, and moves shaping plate P and stage 27 to a portion below inkjet head 77, which is a working position of second printing section 45, as illustrated in FIG. 5. Controller 53 controls second shaping unit 15 based on the shaping data stored in storage device 57 and ejects an insulating material onto shaping plate P from inkjet head 77. The insulating material is, for example, UV curable resin.

Figure 6:
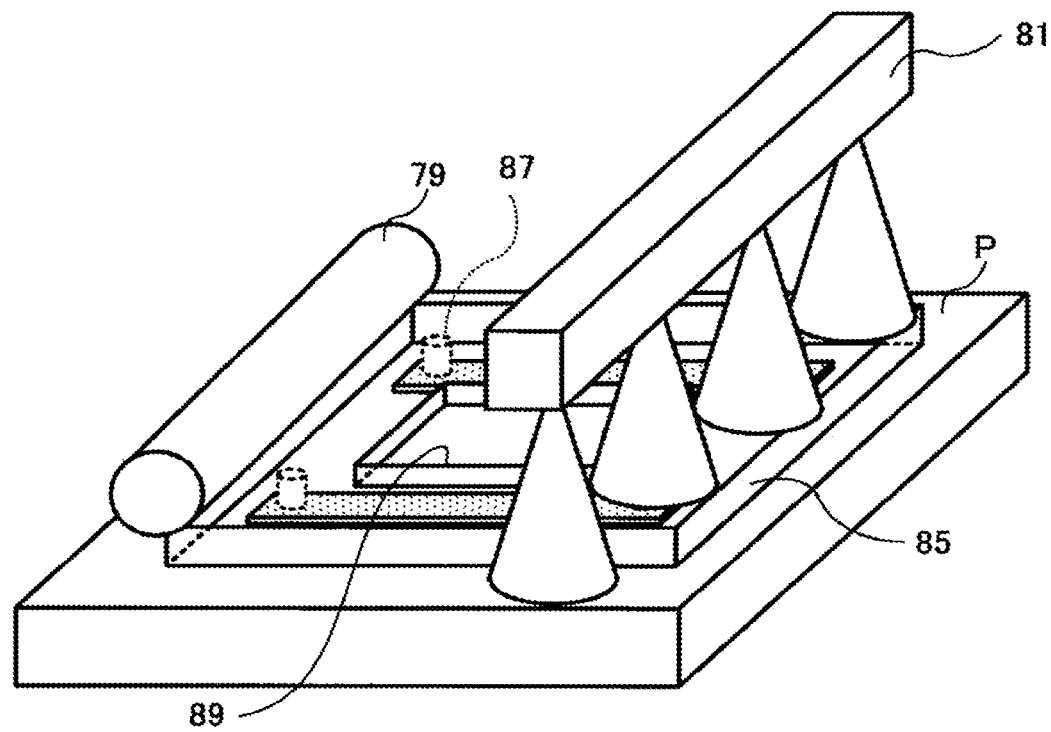
FIG. 6 is a schematic diagram for showing the electronic device manufacturing process.

In addition, controller 53 controls curing section 47 and performs smoothing, by the use of smoothing roller section 79, on the surface of a film of the stratified UV curable resin formed on shaping plate P as illustrated in FIG. 6. Smoothing roller section 79 performs the smoothing of the surface of the workpiece and collection of the surplus UV curable resin by stage 27 moving in the X-axis direction in a state where, for example, smoothing roller section 79 is pressed against the surface of the layered workpiece (three-dimensional article). First shaping unit 13 may also be provided with smoothing roller section 79, as in the case of second shaping unit 15, and the smoothing may also be conducted during the shaping of wiring pattern 75.

Furthermore, controller 53 controls curing section 47 and performs the ultraviolet ray emission from light emitting section 81 and curing on the UV curable resin ejected by inkjet head 77. Controller 53 may also execute the curing process in parallel with the smoothing process by simultaneously driving smoothing roller section 79 and light emitting section 81. Second shaping unit 15 repeatedly executes a series of processes consisting of the ejection by inkjet head 77, the smoothing by smoothing roller section 79, and the curing by light emitting section 81, and thereby shapes insulating layer 85 on wiring pattern 75. Through-hole 87 is shaped in insulating layer 85 in alignment with the position of wiring pattern 75 for pillar 91 (refer to FIG. 7) to be formed. Recessed portion 89 for the embedding of electronic component 95 is shaped in a substantially central portion of insulating layer 85 as well. Methods for forming through-hole 87 and recessed portion 89 are not limited to a formation method by which a position of the UV curable resin ejection from inkjet head 77 is adjusted based on the shaping data. For example, through-hole 87 and the like may be formed by a part of insulating layer 85 being removed by means of laser light emission or the like after insulating layer 85 is formed in the shape of a flat plate. Through-hole 87 and the like may be formed by a support material being used as well. The support material mentioned in the previous sentence is, for example, a mold that is used for a three-dimensional article having a desired shape to be shaped and is removed after the shaping of the three-dimensional article. For example, materials that can be dissolved in certain liquids such as water and chemicals can be used as the support material.

Figure 7:
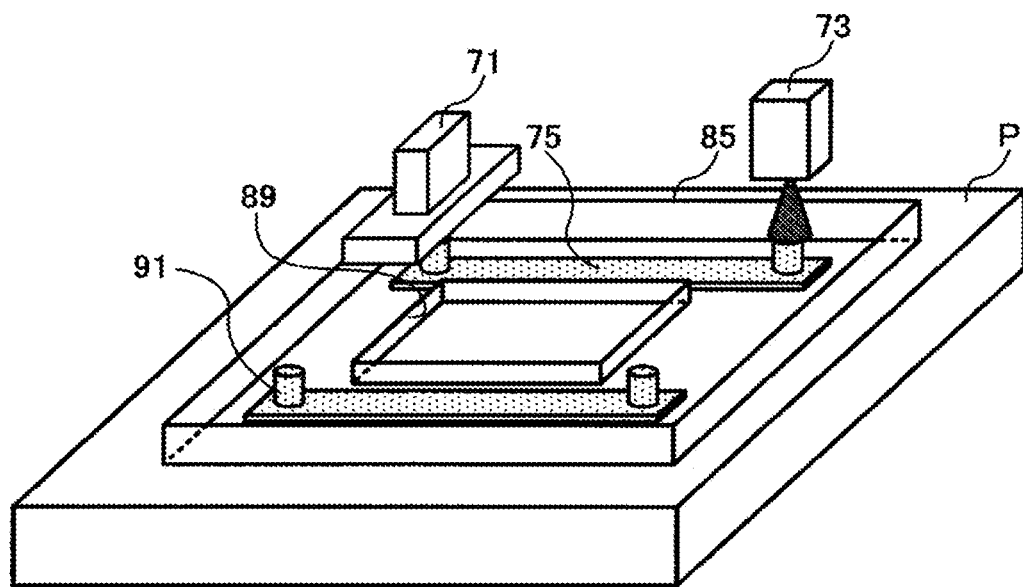
FIG. 7 is a schematic diagram for showing the electronic device manufacturing process.
Figure 8:
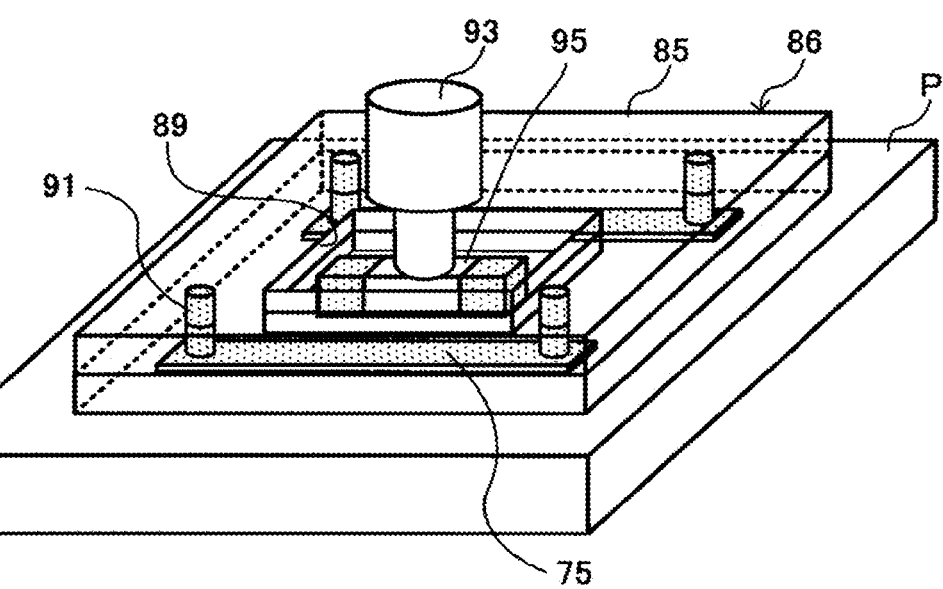
FIG. 8 is a schematic diagram for showing the electronic device manufacturing process.

Subsequently, controller 53 carries stage 27 back into first shaping unit 13 as illustrated in FIG. 7. Controller 53 controls first shaping unit 13 and ejects the conductive material into through-hole 87 from inkjet head 71. In addition, controller 53 controls firing section 43 and performs the laser light emission from emitting section 73 and firing on the conductive material in through-hole 87. Controller 53 conducts the heating process by emitting section 73 in parallel with, for example, the ejection by inkjet head 77. Controller 53 repeatedly executes the ejection by inkjet head 71 and the firing by emitting section 73. Pillar 91 connected to wiring pattern 75 is shaped in the Z-axis direction through insulating layer 85. Then, controller 53 controls first shaping unit 13 and second shaping unit 15, repeatedly executes the above-described processes that are illustrated in FIGS. 3 to 7, and shapes, for example, multilayer wiring board 86 (three-dimensional article) in which insulating layer 85, in which wiring pattern 75 and pillar 91 illustrated in FIG. 8 are formed, is stacked.

Subsequently, controller 53 carries stage 27 into component mounting unit 17. As illustrated in FIG. 8, controller 53 mounts electronic component 95 inside recessed portion 89 by controlling component mounting unit 17 after electronic component 95 is supplied from supply section 49 of mounting section 48 to suction nozzle 93 of mounting head. Negative pressure air or positive pressure air is supplied to suction nozzle 93 from, for example, a positive and negative pressure supply device (not illustrated). Suction nozzle 93 has a structure that picks up and holds the electronic component 95 using negative pressure and releases the held electronic component 95 by a slight positive pressure being supplied. Controller 53 adjusts the position of suction nozzle 93, the direction of electronic component 95, and the like by controlling component mounting unit 17 and mounts electronic component 95 inside recessed portion 89. In the present embodiment, stage 27 that is illustrated in FIG. 1 is provided with lifting and lowering device 35 that rotates base 31 in the θ-axis direction. Accordingly, in manufacturing apparatus 10, the nozzle rotation device or the like may not be disposed in suction nozzle 93 in a case where the direction of electronic component 95 with respect to the multilayer wiring board 86 or the like is adjusted based on the rotation of stage 27 (shaping plate P) by lifting and lowering device 35.

Figure 9:
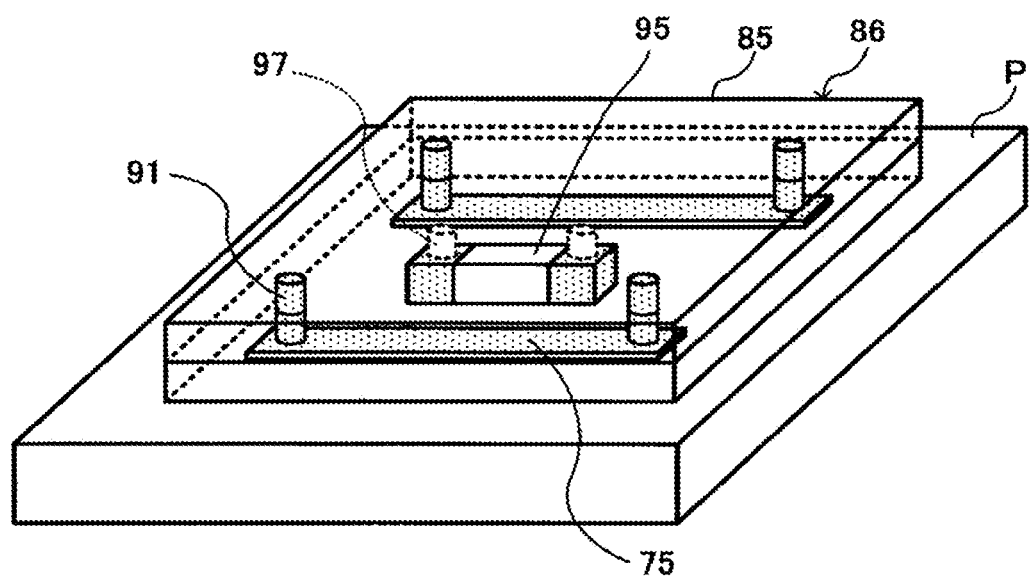
FIG. 9 is a schematic diagram for showing the electronic device manufacturing process.

Subsequently, controller 53 carries stage 27 back into second shaping unit 15. Controller 53 controls second shaping unit 15, repeatedly executes a series of processes consisting of the UV curable resin ejection by inkjet head 77, the smoothing by smoothing roller section 79, and the curing of the UV curable resin by light emitting section 81, and embeds electronic component 95 inside recessed portion 89. As illustrated in FIG. 9, through-hole 97 is formed in multilayer wiring board 86 in alignment with a position of a connection terminal of electronic component 95.

Subsequently, controller 53 carries stage 27 back into first shaping unit 13. Controller 53 controls first shaping unit 13 based on the shaping data and ejects the conductive material into through-hole 97 from inkjet head 71. In addition, controller 53 controls firing section 43 and performs the laser light emission from emitting section 73 and firing on the conductive material in through-hole 97. Controller 53 repeatedly executes the ejection by inkjet head 71 and the firing by the emitting section 73. As illustrated in FIG. 10, pillar 99 connected to the connection terminal of electronic component 95 is shaped in the Z-axis direction through multilayer wiring board 86. In this manner, manufacturing apparatus 10 is capable of manufacturing electronic device 100 on shaping plate P by using the respective units 13, 15, and 17.

Process for Minimizing Path Length of Stage 27

Figure 11:
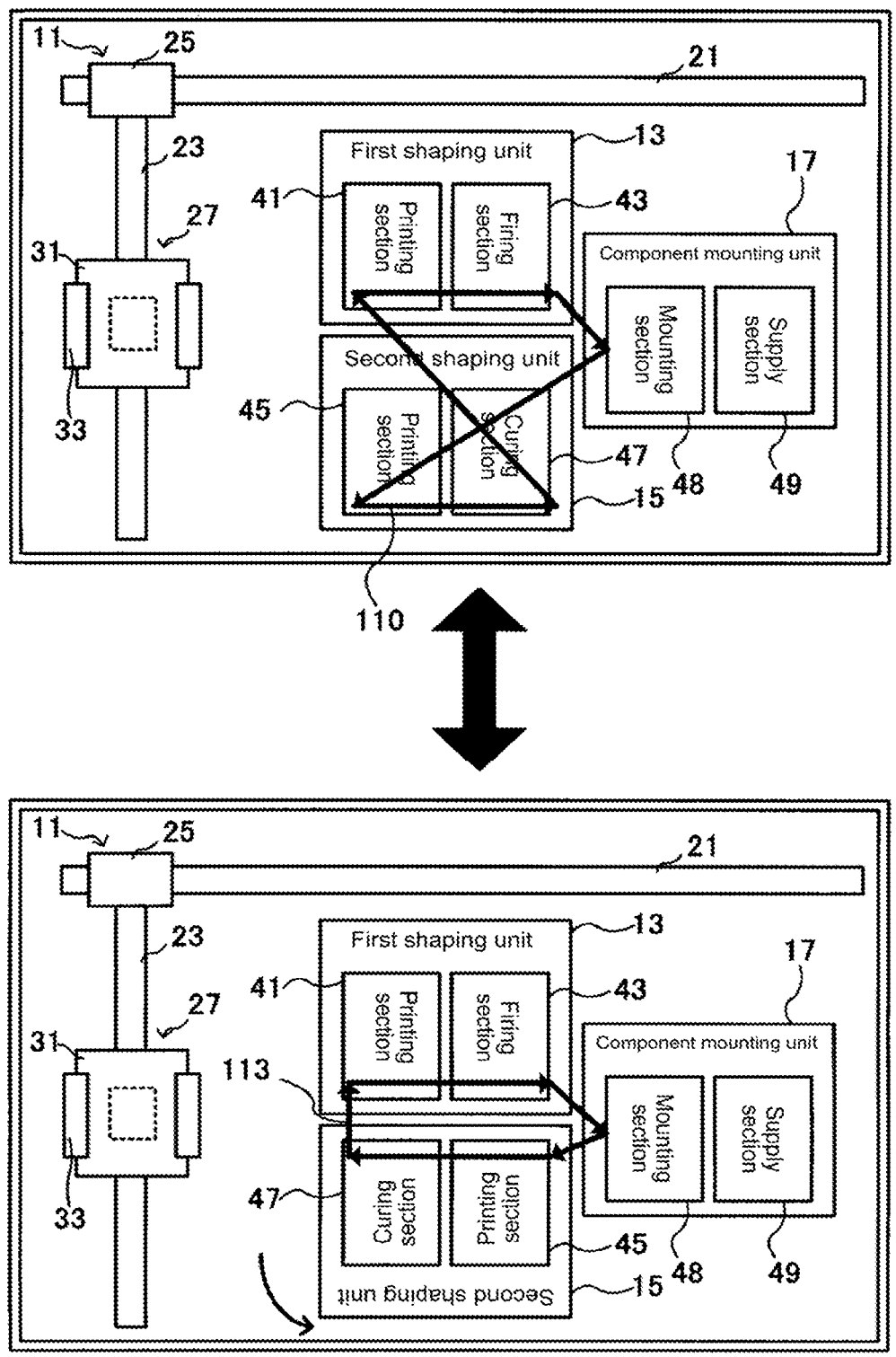
FIG. 11 is a diagram for showing a movement path of a stage during electronic device manufacturing.

Subsequently, control device 51 according to the present embodiment controls conveyance device 11 and each of the units 13, 15, and 17 for each work process based on the control data stored in storage device 57. At this time, the arrangement of each of the units 13, 15, and 17 is determined in manufacturing apparatus 10 such that a path length of stage 27 that moves in accordance with a progress of the work process is minimized. Specifically, FIG. 11 is a diagram illustrating an example of a movement path of stage 27 during the manufacturing of electronic device 100. According to movement path 110 that is illustrated in the upper section of FIG. 11, the work in component mounting unit 17 is conducted after the work in first shaping unit 13 is completed, and then the work in the second shaping unit 15 is conducted last. In a case where this movement along the movement path 110 is frequent in the manufacturing process as a whole, it is effective to change the direction of second shaping unit 15 with respect to the movement direction of stage 27, as seen in movement path 113 that is illustrated in the lower section of FIG. 11. Second shaping unit 15 is rotated by 180 degrees about a straight line along the Z-axis direction. In manufacturing apparatus 10 according to the present embodiment, each of the units 13, 15, and 17 is configured to be capable of being attached to and detached from an apparatus main body, and thus the direction of second shaping unit 15 can be changed by, for example, a user remounting second shaping unit 15 after removing it.

Control device 51 needs to move stage 27 to the working position of second printing section 45 of second shaping unit 15 after the work in component mounting unit 17 has been conducted. In movement path 110, curing section 47 is positioned between mounting section 48 of component mounting unit 17 and second printing section 45 of second shaping unit 15, and this results in an increase in distance. In movement path 113, in contrast, the movement distance from mounting section 48 to second printing section 45 is shorter because second printing section 45 is arranged on the mounting section 48 side with respect to curing section 47. Accordingly, control device 51 determines the arrangement of each of the units 13, 15, and 17 before the execution of the work process varying with the type of electronic device 100 to be manufactured such that the path lengths of movement paths 110 and 113 along which stage 27 moves as a result of the execution of that work process are minimized. Then, for example, control device 51 displays the optimized arrangement of each of the units 13, 15, and 17 in a display section and notifies the user or the like of the optimized arrangement of each of the units 13, 15, and 17.

In the embodiment described above, conveyance device 11 is an example of a driving device. First shaping unit 13 and second shaping unit 15 are examples of a shaping unit. Component mounting unit 17 is an example of a mounting unit. Control device 51 is an example of a control section. Inkjet heads 71 and 77 are examples of an ejecting section. Electronic device 100 is an example of an electrical device. The X-axis direction and the Y-axis direction are examples of first and second directions. The Z-axis direction is an example of a third direction.

The following effects can be achieved by the present embodiment described above.

Effect 1

Manufacturing apparatus 10 is provided with conveyance device 11 that moves stage 27, where the workpiece (multilayer wiring board 86) is placed, in the X-axis direction and the Y-axis direction. In addition, first shaping unit 13, second shaping unit 15, and component mounting unit 17 are arranged within a range in which stage 27 can move. Electronic device 100 is manufactured on stage 27 by controller 53 of control device 51 sequentially moving stage 27 to the working positions of the respective units 13, 15, and 17 in accordance with the control data stored in storage device 57 and setting the work process or the like for the manufacturing of electronic device 100. Accordingly, in manufacturing apparatus 10, removal and repositioning of the workpiece on stage 27 during the execution of each work process such as the shaping of wiring pattern 75 by first shaping unit 13, the shaping of insulating layer 85 by second shaping unit 15, and the mounting of electronic component 95 by component mounting unit 17 do not have to be performed and a smooth work process transition is achieved. As a result, manufacturing apparatus 10 achieves a reduction in the length of time required for a work process transition.

In manufacturing apparatus 10, stage 27 that is used is shared by the respective units 13, 15, and 17, and any one of the units 13, 15, and 17 performs work only when the rest of the units 13, 15, and 17 are not performing work. Accordingly, the units 13, 15, and 17 are capable of causing parts of work regions in which inkjet head 71 and the mounting head move to overlap with each other. Accordingly, manufacturing apparatus 10 allows the respective units 13, 15, and 17 to be arranged in close proximity to one another, allows stage 27 to complete its movement within a short period of time, and allows the apparatus to be compact in overall size.

Effect 2

Controller 53 is capable of moving stage 27 in the three directions orthogonal to one another (in each of the X, Y, and Z directions) by controlling X-axis slide mechanism 21, Y-axis slide mechanism 23, and lifting and lowering device 35 of conveyance device 11. As a result, manufacturing apparatus 10 is capable of continuing to perform the shaping process without adjusting the working position of second shaping unit 15 by conveyance device 11 adjusting the position of stage 27 in the Z-axis direction in response to an increase in the number of layers of multilayer wiring board 86 to be formed of the multiple layers, for example. Accordingly, each of the units 13, 15, and 17 does not require a driving mechanism or the like for Z-axis direction movements of inkjet heads 71 and 77 and the mounting head, and the units 13, 15, and 17 can be compact in size as a whole.

Effect 3

In manufacturing apparatus 10, the respective working positions of the units 13, 15, and 17 are positioned on the same plane parallel to one another in the X-axis direction and the Y-axis direction with the respective working positions of the units 13, 15, and 17 fixed in the Z-axis direction. Accordingly, in manufacturing apparatus 10, the amount of adjustment by which stage 27 is adjusted in position with respect to the Z-axis direction is extremely small, or the adjustment is not required at all, in the case of a movement of stage 27 between the respective units 13, 15, and 17, and the length of the work time that is required for a positional adjustment of stage 27 moving between the units 13, 15, and 17 during the work process transition, that is, the length of manufacturing time, can be further reduced.

Effect 4

First shaping unit 13 and second shaping unit 15 are provided with inkjet heads 71 and 77, and the three-dimensional article (multilayer wiring board 86) that is made up of the multiple layers can be appropriately shaped on stage 27 (shaping plate P) by inkjet heads 71 and 77 being driven.

Effect 5

First shaping unit 13 shapes wiring pattern 75 by ejecting the conductive material from inkjet head 71 and firing it by the use of firing section 43. Second shaping unit 15 shapes insulating layer 85 by ejecting the UV curable resin from inkjet head 77 and curing it by the use of curing section 47. Accordingly, manufacturing apparatus 10 is capable of quickly shaping multilayer wiring board 86 by additive manufacturing by moving stage 27 between first and second shaping units 13 and 15 and appropriately using the first and second shaping units 13 and 15 depending on the work process for the shaping of wiring pattern 75 or insulating layer 85.

Effect 6

Manufacturing apparatus 10 is configured to allow each of the units 13, 15, and 17 to be attached to and detached from the connecting section disposed in the upper portion of the apparatus, and thus additional installation of a necessary unit and removal of an unnecessary unit can be performed depending on the type, structure, and the like of electronic device 100 to be manufactured. Accordingly, manufacturing apparatus 10 is capable of responding to the manufacturing of various types of electronic devices 100, thus enhancing its versatility.

Effect 7

In manufacturing apparatus 10, the disposition of each of the units 13, 15, and 17 is determined such that the path length of stage 27 moved as a result of the progress of the work process is minimized. Accordingly, the user of manufacturing apparatus 10 or the like can reduce the length of movement time of stage 27 that moves between the units 13, 15, and 17 during the work process transition by, for example, changing the direction of each of the units 13, 15, and 17 (refer to FIG. 11) in accordance with display content displayed on the display section or the like by control device 51.

The present disclosure is not limited to the embodiment described above and can be carried out in various modified or improved forms based on the knowledge of those skilled in the art. For example, although conveyance device 11 according to the embodiment described above is configured to be capable of moving stage 27 in four axial directions (in each of the X, Y, Z, and θ directions), the present disclosure is not limited thereto and, for example, conveyance device 11 may be configured to be capable of moving stage 27 in only two directions, one being the X-axis direction and the other one being the Y-axis direction. In this case, lifting and lowering device 35 that moves stage 27 in the Z-axis direction and the θ-axis direction can be omitted. In addition, each of the units 13, 15, and 17 may be configured for the respective working positions of the units 13, 15, and 17 to be variable in the Z-axis direction.

Figure 12:
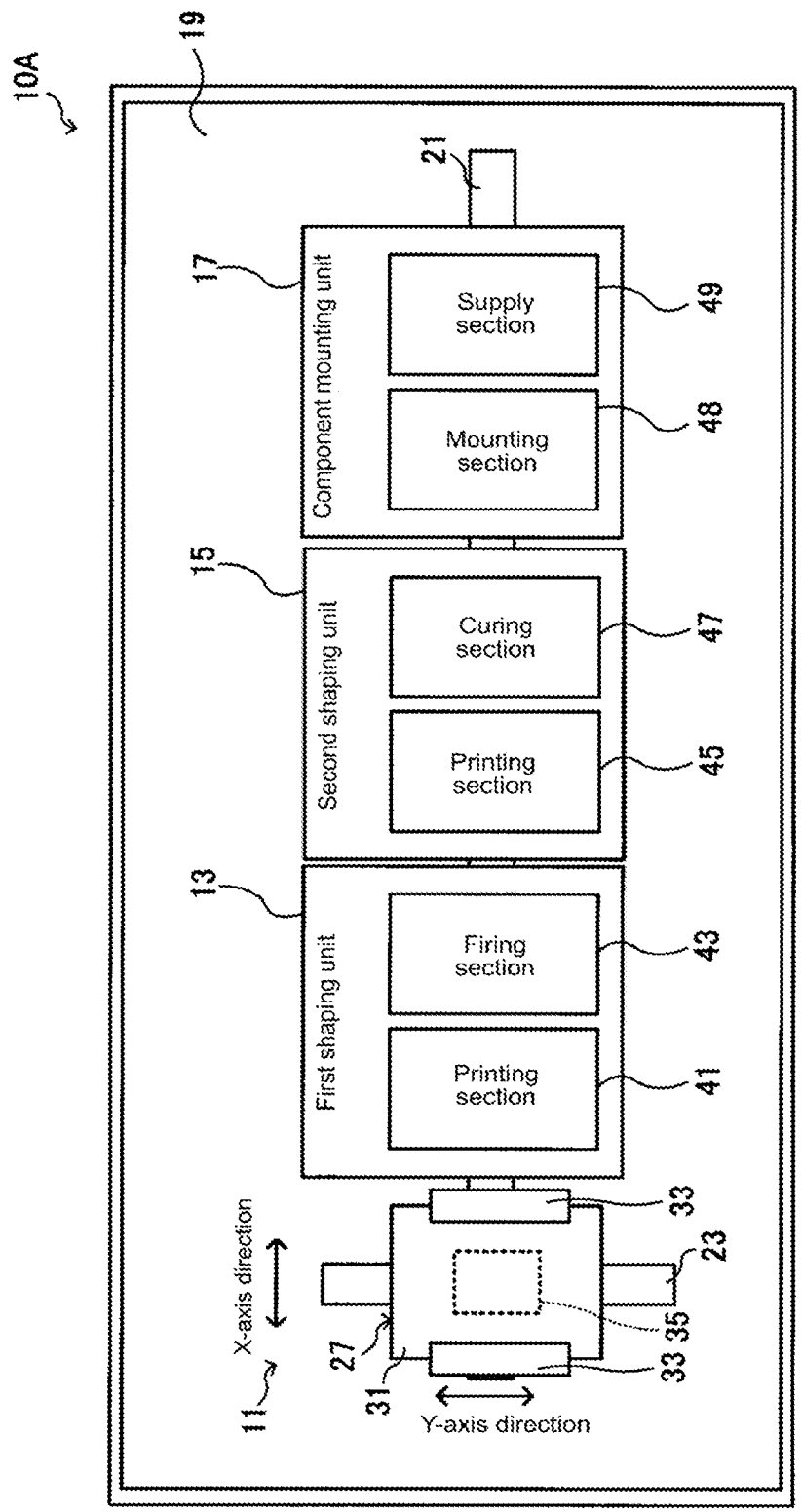
FIG. 12 is a schematic diagram illustrating a configuration of an electronic device manufacturing apparatus according to another embodiment.

The disposition of each of the units 13, 15, and 17 according to the embodiment described above is merely an example and can be appropriately changed. For example, a configuration may be adopted in which the respective units 13, 15, and 17 are arranged on the same straight line along the X-axis direction as in manufacturing apparatus 10A illustrated in FIG. 12. In this configuration, Y-axis slide mechanism 23 for moving stage 27 in the Y-axis direction can be omitted by, for example, a positional adjustment being performed with respect to the Y-axis direction on the side of each of the units 13, 15, and 17 (such as inkjet head 71). In other words, conveyance device 11 can be simplified in the form of a configuration made up of only X-axis slide mechanism 21 that moves stage 27 in the X-axis direction. In the embodiment described above, the respective working positions of the units 13, 15, and 17 may be different positions in the Z-axis direction instead of the working positions aligned on the same planes.

Figure 13:
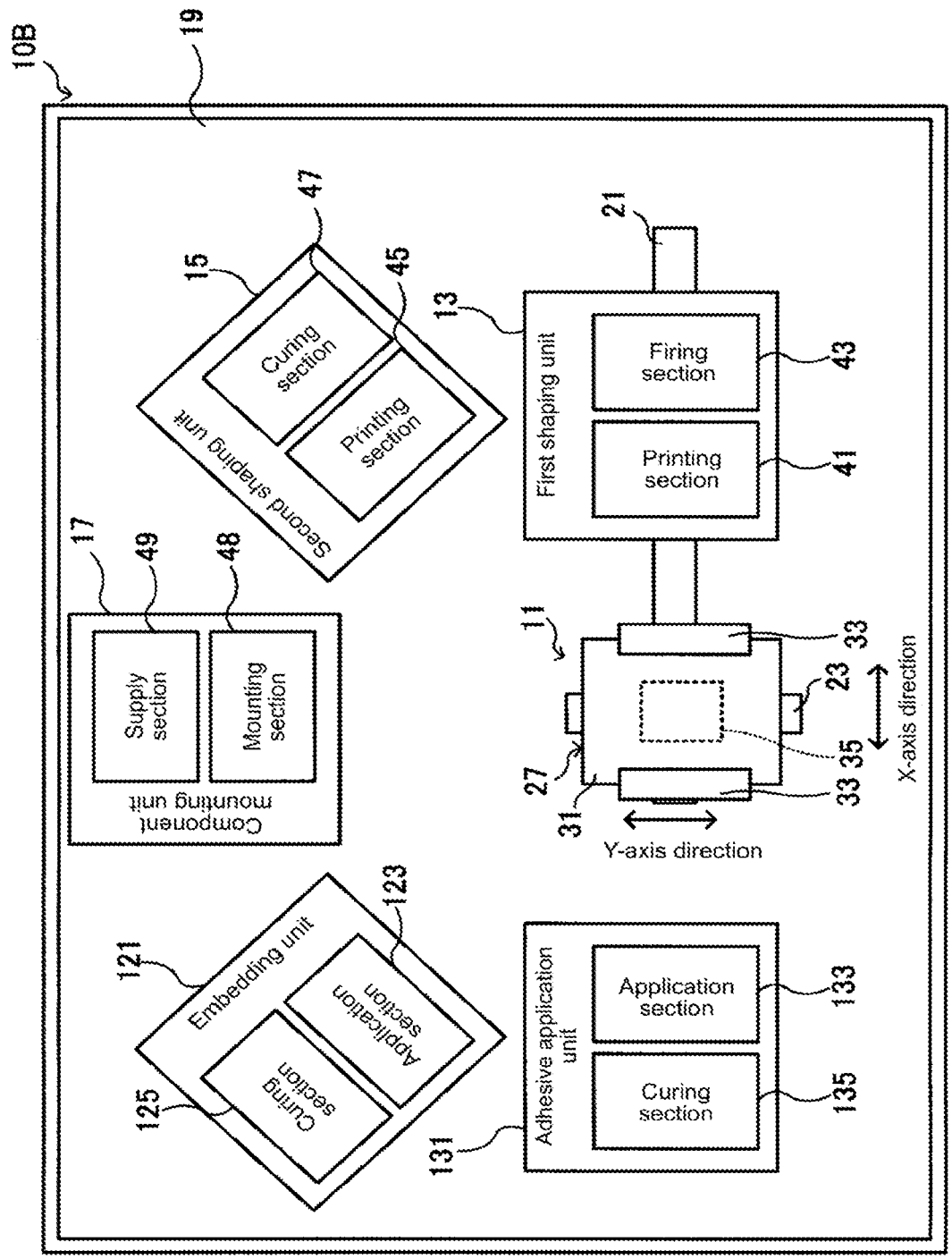
FIG. 13 is a schematic diagram illustrating a configuration of an electronic device manufacturing apparatus according to another embodiment.

Although manufacturing apparatus 10 according to the embodiment described above is provided with two shaping units 13 and 15, a configuration may be adopted instead in which only one shaping unit is provided. Manufacturing apparatus 10 according to the embodiment described above may also be configured to be provided with a unit other than the three units 13, 15, and 17 that has a different function. For example, manufacturing apparatus 10B illustrated in FIG. 13 is provided with embedding unit 121 and adhesive application unit 131 in addition to the three units 13, 15, and 17. In manufacturing apparatus 10B, each of the units 13, 15, 17, 121, and 131 is arranged on a circumference about a connecting part (initial position of stage 27) between X-axis slide mechanism 21 and Y-axis slide mechanism 23. Embedding unit 121 is, for example, a unit for filling a relatively large hole or the like similar to recessed portion 89 according to the first embodiment with W curable resin, and embedding unit 121 is provided with first application section 123 and first curing section 125. First application section 123 has, for example, a dispenser that provides an ejection amount greater than that of inkjet head 77 of second printing section 45. First curing section 125 has a light source (such as a mercury lamp and an LED) that emits more light than light emitting section 81 of curing section 47.

Adhesive application unit 131, which is a unit for adhesion and fixing of electronic component 95 or the like to insulating layer 85, is provided with second application section 133 and second curing section 135. Second application section 133 applies, for example, a UV curing adhesive to an upper face of insulating layer 85 where electronic component 95 is arranged. Although the type of the adhesive is not particularly limited, it is preferable that the adhesive is selected based on, for example, a heat shrinkage factor and an adhesive strength in accordance with the material of the three-dimensional article (insulating layer 85 and electronic component 95). Second curing section 135 causes electronic component 95 to adhere to the insulating layer 85 by applying the adhesive with ultraviolet rays. In a case where electronic component 95 that is mounted is relatively large in size, for example, recessed portion 89 needs to be large in size and adhesion is required for electronic component 95, and thus manufacturing apparatus 10B that has the configuration illustrated in FIG. 13 is effective. The functions of the units added to manufacturing apparatus 10B (embedding unit 121 and adhesive application unit 131) are merely examples. The present disclosure is not limited thereto and manufacturing apparatus 10B may also be provided with, for example, a solder application and firing unit.

In the embodiment described above, the additive manufacturing for multilayer wiring board 86 is not limited to droplet ejection such as inkjetting and it may be replaced with a shaping method employing powder material spreading and binder-based powder material coupling. Alternatively, it may be replaced with a shaping method employing powder material spreading and sintering based on application of laser light. Although each of the units 13, 15, and 17 according to the embodiment described above is configured to be attachable and detachable, the units 13, 15, and 17 may also be integrated with the apparatus main body not to be capable of being removed instead.

REFERENCE SIGNS LIST

10: manufacturing apparatus, 11: conveyance device, 13: first shaping unit, 15: second shaping unit, 17: component mounting unit, 27: stage, 51: control device, 77, 71: inkjet head, 95: electronic component, 100: electronic device

The invention claimed is:

1. A manufacturing apparatus comprising:
a stage including a placing surface where an article is placed;
a conveyor configured to move the stage in a first direction and a second direction, the first direction and the second direction being directions parallel to the placing surface and different from each other;
a three-dimensional manufacturing device that is disposed within a range in which the stage can be moved and is configured to form each layer of multiple layers of the article;
a component mounting device that is disposed within the range in which the stage can be moved and is configured to mount an electronic component on the article, the component mounting device including a component supply configured to hold a plurality of electronic components and a mounting device configured to pick up the electronic component from the component supply and place the electronic component on the article; and
controller circuitry configured to:
control the conveyor to sequentially move the stage from a working position of one of the three-dimensional manufacturing device or the component mounting device to a working position of the other of the three-dimensional manufacturing device or the component mounting device along a path determined based on a work process to perform additive manufacturing of an electrical device on the stage, and
determine an arrangement of the three-dimensional manufacturing device and the component mounting device including a first position at which the three-dimensional manufacturing device is disposed and a second position at which the component mounting device is disposed such that the path is minimized in length, wherein the first position and the second position are stationary with respect to each another while the three-dimensional manufacturing device forms each of the layers when the stage is at the working position of the three-dimensional manufacturing device, and
the first position and the second position are stationary with respect to each another while the component mounting device mounts the electronic component when the stage is at the working position of the component mounting device.

2. The manufacturing apparatus according to claim 1,
wherein the first direction and the second direction are directions orthogonal to each other, and
wherein the conveyor is configured to move the stage in a third direction as well as the first and second directions, the third direction being orthogonal to the placing surface.

3. The manufacturing apparatus according to claim 2, wherein the working positions of the three-dimensional manufacturing device and the component mounting device are fixed with respect to the third direction and are positioned on the same plane.

4. The manufacturing apparatus according to claim 1, wherein the three-dimensional manufacturing device includes a nozzle that ejects a liquid material onto the article by droplet ejection.

5. The manufacturing apparatus according to claim 4,
wherein the article is a multilayer wiring board, and
wherein multiple of the three-dimensional manufacturing device are provided including at least a first three-dimensional manufacturing device configured to form a wiring pattern by firing a conductive material ejected onto the multilayer wiring board by the respective nozzle, and a second three-dimensional manufacturing device configured to form an insulating layer by curing an insulating material ejected onto the multilayer wiring board by the respective nozzle.

6. The manufacturing apparatus according to claim 1, wherein the three-dimensional manufacturing device and the component mounting device are each attachable to and detachable from a manufacturing apparatus main body.

7. The manufacturing apparatus according to claim 6, wherein the controller circuitry is configured to determine the arrangement of the three-dimensional manufacturing device and the component mounting device with respect to each other, a movement direction of the stage, and the manufacturing apparatus main body such that the path is minimized in length.

8. The manufacturing apparatus according to claim 7, wherein the controller circuitry is configured to control a display to display the arrangement of the three-dimensional manufacturing device and the component mounting device to a user.

9. The manufacturing apparatus according to claim 1,
wherein the component supply includes at least one of a tray and a feeder, and
wherein the mounting device includes a mounting head.

10. The manufacturing apparatus according to claim 1, wherein the three-dimensional manufacturing device includes at least one of a stereo lithography device, a selective laser sintering device, a fused deposition molding device, a UV curing inkjetting device, and an inkjet bindering device.

11. The manufacturing apparatus according to claim 1, wherein the conveyor includes at least one motor.

12. The manufacturing apparatus according to claim 2, wherein the conveyor includes at least one motor and an air cylinder.

* * * * *